United States Patent [19]

Zogg

[11] Patent Number: 4,743,949
[45] Date of Patent: May 10, 1988

[54] INFRARED OPTICAL-ELECTRONIC DEVICE

[76] Inventor: Hans Zogg, Weiherackerstrasse, 1 CH-8114 Dänikon, Switzerland

[21] Appl. No.: 855,748
[22] PCT Filed: Jul. 9, 1985
[86] PCT No.: PCT/CH85/00110
§ 371 Date: Mar. 6, 1986
§ 102(e) Date: Mar. 6, 1986
[87] PCT Pub. No.: WO86/00756
PCT Pub. Date: Jan. 30, 1986

[30] Foreign Application Priority Data

Jul. 10, 1984 [CH] Switzerland .......................... 3460/84

[51] Int. Cl.[4] .................... H01L 29/161; H01L 27/14
[52] U.S. Cl. .......................................... 357/16; 357/4; 357/6; 357/30; 357/61
[58] Field of Search ...................... 357/4, 6, 16, 30, 17, 357/11, 61

[56] References Cited

U.S. PATENT DOCUMENTS

| | | |
|---|---|---|
| 4,117,504 | 9/1978 | Maslov et al. |
| 4,119,994 | 10/1978 | Tain et al. ............................... 357/16 |
| 4,144,540 | 3/1979 | Bottka ................................... 357/16 |
| 4,154,631 | 8/1979 | Schooler ............................... 357/30 |
| 4,197,469 | 4/1980 | Cheung ........................... 357/24 LR |
| 4,212,019 | 7/1980 | Wataze et al. ......................... 357/16 |
| 4,546,375 | 10/1985 | Blackstone et al. .................... 357/4 |

FOREIGN PATENT DOCUMENTS

58-84423 5/1983 Japan .

OTHER PUBLICATIONS

P. W. Sullivan, "Growth of Single Crystal SrF$_2$ (001)/GaAs(001) Structues by Molecular Beam Epitaxy" in Applied Physics Letters, vol. 44, No. 2, Jan. 15, 1984, pp. 190-192.

Hiroshi Ishiwara et al., "Lattice-Matched Epitaxial Growth of Semiconductor Films onto Insulator (Mixed Fluoride) Si Structures" in Japanese Journal of Applied Physics Supplements, vol. 22, Supply. No. 22-1, 1983, pp. 201-204.

P. W. Sullian et al., "Insulating Epitaxial Films of BaF$_2$, CaF$_2$ and Ba$_x$Ca$_{1-x}$F$_2$ Grown by MBE on InP Substrates", in *Journal of Crystal Growth*, vol. 60, No. 2, Dec. 1982, pp. 403-413.

D. K. Hohnke et al., "Epitaxial PbSe and Pb$_{1-x}$Sn$_x$Se: Growth and Electrical Properties" in Journal of Applied Physics, vol. 45, No. 2, Feb. 1974, pp. 892-897.

Tanemasa Asano et al., "Heteroepitaxial Growth of Group-IIA-Fluoride Films on Si Substrte" in Japanese Journal of Applied Physics, vol. 22, No. 10, Oct. 1982, pp. 1474-1481.

Tanemasa Asano et al., "Epitaxial Growth of Ge Films onto CaF$_2$/Si Structures" in Japanese Journal of Applied Physics, vol. 21, No. 10, Oct. 1982, pp. 630-632.

H. Zogg et al., "MIS Capacitors on BaF$_2$/PbSe Layers ... for IR Detection" in *Infrared Phys.*, 25, 333 (1985).

H. Zogg et al., "Growth of High Quality Epitaxial PbSe ... Buffer Lauer" in *Appl. Phys. Lett.*, 47 (2) Jul. 15, 1985.

*Primary Examiner*—J. Carrol
*Attorney, Agent, or Firm*—Watson, Cole, Grindle & Watson

[57] ABSTRACT

On a semiconductor substrate (1), e.g. of Si, a IIa-metal-fluoride layer (2) and in that a narrow-gap semiconductor layer (3), e.g. of a lead-chalcogenide, is epitaxially grown. In the narrow-gap semiconductor layer (3) one or more infrared sensors (4) are integrated. In the semiconductor substrate (1) is integrated at least one part of an electronic circuit arrangement (5) for interpretation of the electric signals supplied by the sensors (4). The fluoride layer (2) exhibits at its interfaces lattice constants which lie between, or close to, the different lattice constants of the semiconductor substrate (1) and the narrow-gap semiconductor layer (3). For a better lattice match at the interfaces of the fluoride layer (2) to the semiconductor substrate (1) on the one hand and to the narrow-gap semiconductor layer (3) on the other, the fluoride layer consists appropriately of a mixed crystal Ca$_x$Sr$_y$Ba$_z$Cd$_{1-x-u-z}$F$_2$ with $0 \leq x, y, z \leq 1$, whereby its composition, and therefore its lattice constant, changes over the thickness of the layer.

10 Claims, 1 Drawing Sheet

INFRARED OPTICAL-ELECTRONIC DEVICE

BACKGROUND OF THE INVENTION

The present invention relates to an optical-electronic device with at least one infrared radiation-sensitive optical-electronic transducer which conducts or emits infrared radiation.

Optical-electronic thermal imaging cameras are known in which a multitude of infrared sensitive sensors are arranged in the focal plane of lens configuration for infrared radiation, a each of the sensors producing an electric signal relative to the intensity of prevailing infrared radiation. The totality of the electrical signals thus gained, amplified and, if necessary, corrected makes it possible to interpret the heat image, e.g., making it visible to the human eye. Previously, numerous individual sensors for detecting heat images were arranged in a one- or two-dimensional array or field. The most sensitive of these prior arrays exhibit a hybrid arrangement: The individual sensors are positioned on a chip consisting of a narrow-gap semiconductor material. The required electronic circuit configurations for amplifying and multiplexing the electric signals are configured on a second silicon chip. A separate electric connection is required between each sensor and the circuit configuration on the silicon chip, which is very impractical for a larger number of sensors and limits the number of sensors to be combined in one array. So so-called focal plane arrays are described in the periodic conference reports Proc. SPIE, Soc. Opt. Engineering, vol. 409 (1983), and earlier ones and elsewhere.

It is the goal and function of the current invention to create an optical-electronic device of the type described above which, instead of a relatively complicated hybrid configuration, has a considerably simplified monolithic configuration, enabling it, e.g., to integrate an increased number of infrared sensors or infrared-radiation emitting diodes within one device.

SUMMARY OF THE INVENTION

The present optical-electronic device is characterized by the fact that on one semiconductor substrate, with the help of at least one intermediate layer, grown epitaxially on the substrate, an additional semiconductor layer is grown epitaxially from a narrow-gap semiconductor, that into this narrow-gap semiconductor layer the optical-electronic transducer is integrated, and that the intermediate layer at each of its interfaces with the semiconductor substrate and with the narrow-gap semiconductor layer there are lattice constants which lie between or close to those of the semiconductor substrate or, respectively, those of the narrow-gap semiconductor layers.

Thus, as a result of the invention, it is now possible to connect through epitaxy a narrow-gap semiconductor layer and a semiconductor substrate with significantly different lattice constants into a monolithic electronic device with the aid of at least one intermediate layer. It has been shown that by choosing the right type of intermediate layer, an epitaxial connection of the intermediate layer with the semiconductor substrate and with the narrow-gap semiconductor layer is also possible when the lattice constants of each of the adjoining materials do not exactly correspond.

The intermediate layer can be appropriately constructed out of two or more partial intermediate layers with varying lattice constants in such a way that at each of the interfaces of adjoining layers—including the semiconductor substrate and the narrow-gap semiconductor layer—the lattice constants of the various materials differ only insignificantly from one another.

In the case of another useful design of the device of the invention, the intermediate layer consists of a mixed crystal whose composition is gradually altered over the thickness of the intermediate layer in such a way that the intermediate layer at its interfaces to the semiconductor substrate and to the narrow-gap semiconductor layer exhibits lattice constants which are close to the lattice constants of the semiconductor substrate or, respectively, to the narrow-gap semiconductor layer.

The material of the intermediate layer is preferably a fluoride of a metal of the IIa group or a mixed crystal of such a metallic fluoride.

The invention and its advantages are explained below in detail strictly by way of examples and with reference to the attached drawings.

DETAILED DESCRIPTION OF THE PREFERRED EMBODIMENT

Figure 1:
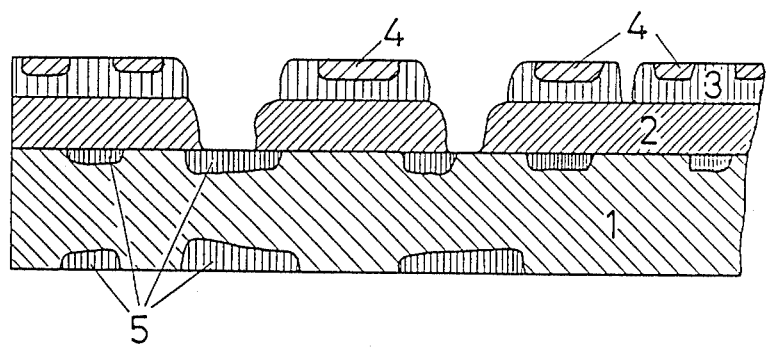
FIG. 1 is a schematic profile of an optical-electronic device in accordance with the invention.

The optical-electronic device illustrated in FIG. 1 has a semiconductor substrate 1, an intermediate layer 2 that is epitaxially grown on it, and a narrow-gap semiconductor layer 3 which is in turn epitaxially grown onto the intermediate layer 2. Several infrared sensitive sensors 4 are integrated into the narrow-gap semiconductor layer 3. In the semiconductor substrate 1, parts 5 of an electronic circuit arrangement are integrated for the utilization, particularly amplification and multiplexing, of the electric voltages provided by sensors 4, whereby the circuit arrangements may also contain so-called charge coupled devices.

Figure 2:
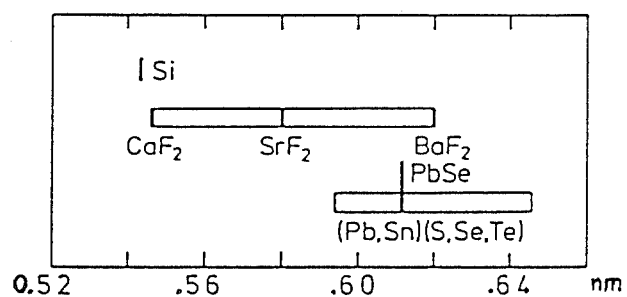
FIG. 2 is a diagram illustrates the lattice constants of various materials which are suitable for the optical-electronic device.

The semiconductor substrate 1 consists, e.g., of (111)-Si whose lattice constant (at customary room temperature) is 0.543 nanometer [nm] (FIG. 2). The narrow-gap semiconductor layer 3 consists, e.g., of PbSe with a lattice constant of 0.612 nm. The intemediate layer 2 is composed of several partial intermediate layers with slight variation in their lattice constants. Directly above semiconductor substrate 1, a first partial intermediate layer is epitaxially grown from pure $CaF_2$ whose lattice constant at room temperature is 0.546 nm and, therefore, only 0.6% larger than that of Si. The final partial intermediate layer, which is the one adjoining the narrow-gap semiconductor layer 3, consists of pure $BaF_2$ with a lattice constant of 0.620 nm which is 1.2% larger than that of PbSe. Further partial intermediate layers are composed of mixed crystals which are altered gradually or in steps and have the formula of $Ca_{1-x}Ba_xF_2$ in which x has a value between 0 and 1 and increases in the direction of the last partial intermediate layer. The lattice constants of these mixed crystals lie between those of $CaF_2$ and $BaF_2$ and also increase as x becomes larger. Thus the lattice constant of intermediate layer 2 varies throughout its thickness from a value close to the lattice constant of the semiconductor substrate Si to a value close to that of the lattice constant of the narrow-gap semiconductor layer PbSe.

The previously described intermediate layer 2 can be built up by molecular beam epitaxy or epitaxially through conventional vacuum evaporation as described, e.g., for $CaF_2$—, $SrF_2$— or $BaF_2$— growth by T. Asano et al. in *Jap. J. Appl. Pys.* 22, 1474 1983.

For constructing the intermediate layer, two separate crucibles may be used of which one contains $BaF_2$ and one $CaF_2$, in which the growth rates can be controlled, for instance, by two oscillating crystals. The required pressure inside the receiver should be below $7 \times 10^{-5}$ Pa ($5 \times 10^{-7}$ Torr); however, it is not essential to work under conditions of an ultra-high vacuum (UHV). The polished Si wafer will be kept at a temperature of 200°–800° C. during the evaporation process and should preferably be brought to an even higher temperature for cleaning its surface before evaporation begins. The rate of evaporation, at the beginning of the evaporation process, should preferably be kept below 0.01 nm/sec before a first cohesive layer has formed and can subsequently—if the temperature is sufficiently high and the surface of the layer sufficiently clean—be raised to about 1 nm/sec provided the pressure conditions within the receiver are adequate. In the present example pure $CaF_2$ is being evaporated. Accordingly, by an appropriate gradual increase of the temperature of the $BaF_2$ source and a reduction of the temperature of the $CaF_2$ source, a mixed crystal of $Ca_{1-x}Ba_xF_2$ with a gradually changing composition and a gradually increasing value for x is being formed until, finally, pure $BaF_2$ is being evaporated. The thickness of the entire intermediate layer 2 can be about 10 nm up to several $\mu$m. Although a $(Ba,Ca)F_2$ mixed crystal is thermodynamically unstable according to known phase plots, it is also known that a metastable mixed crystal is formed through evaporation from the gaseous phase.

Alternatively, the desired composition of intermediate layer 2 can also be obtained through the mixed crystal series:

which also forms under equilibrium conditions. The lattice match between Si substrate 1 and intermediate layer 2 at the beginning of evaporation can also be improved by inclusion of $Cd_{1-y}Ca_yF_2$ with y being approximately equal to 0.6. The same holds true for the interface PbSe/intermediate layer, whereby the lattice match can be further improved through $Ca_{1-x}Ba_xF_2$, where x is approximately equal to 0.9. The PbSe layer 3 is subsequently grown in a separate system, e.g., by hot-wall epitaxy, up to a layer thickness in the range of, e.g., 0.5–5 $\mu$m, as described, for instance, by H. Holloway in 'Physics of Thin Films,' 11, 105 (1980).

The infrared sensors 4 could consist of, e.g., PbTe of $PbS_{1-x}Se_x$ with $0 \leq x \leq 1$ in which case the sensors in the infrared window are sensitive to wave-lengths of 3–5 $\mu$m. However, if the sensors 4 consist of $Pb_{1-x}Sn_xTe$ with x being approximately equal to 0.2 or of $Pb_{1-x}Sn_xSe$ with x being approximately equal to 0.07, an infrared sensitivity results in the window for wave-lengths of 8–14 $\mu$m.

The remaining procedural steps for producing the optical-electronic device are similar to those for customary production of integrated electrononic chips. The desired lateral structure of fluoride layer 2 and/or PbSe layer 3, for instance for different sized planar areas as shown in FIG. 1, can be obtained with the help of a planar mask during the production of the layer or subsequently through a photolithographic method. Through subsequently evaporated Pb-layers, Schlottky contacts and with sputtered Pt the required ohmic connection structure (not shown in FIG. 1) can be produced. Alternatively, photo-voltaic infrared sensors 4 can be produced through diffusion or ion implantation. Electrical connections to Si-Wafer 1, not shown, are etched through electrically insulated intermediate layer 2, if necessary additional insulation layers on the PbSe layer 3 are added for electrical insulation and the required electric connection structure is defined through an evaporated metal and appropriate etching.

The example described above can be modified in various ways. It is possible, for instance, to produce substrate 1 from a material of the group Ge, $Ga_{1-x}Al_x$, InP, InSb and CdTe instead of Si, with or without an epitaxially grown layer out of the same or a similar semiconductor material.

Furthermore, aside from PbSe, other materials can be used for narrow-gap semiconductor layer 3 such as PbTe, PbS, $Pb_{1-x}Sn_xTe$, $Pb_{1-x}Sn_xSe$, $PbS_{1-x}Se_x$ or $Pb_{1-x}Cd_xS$, where in each case $0 \leq x \leq 1$ or, written generally and concretely:

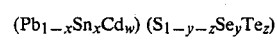

where $$0 \leq w \leq 1, 0 \leq x \leq 1, 0 \leq y \leq 1, 0 \leq z \leq 1$$

whereby one or more of the parameter w, x, y, z can be varied over the thickness of the layer.

It is also possible to use other narrow-gap semiconductors, such as $Hg_{1-x}Cd_xTe$ or $InAs_xSb_{1-x}$ ($0 \leq x \leq 1$), if necessary with changing composition of x throughout the thickness of the layer.

Intermediate layer 2 can generally be grown out of fluorides from metals of the IIa ($MF_2$, wherein M=metal) group, particularly as the mixed crystal

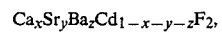

where $$0 \leq x \leq 1, 0 \leq y \leq 1, 0 \leq z \leq 1,$$

whereby the lattice constant of the mixed crystal is dependent on the values of x, y, and z. The peripheral compositions, also described with the above-mentioned formula as a special case, exhibit the following lattice constants d at room temperature (see FIG. 2):

$CdF_2$ d=0.539 nm $CaF_2$ d=0.546 nm $SrF_2$ d=0.580 nm $BaF_2$ d=0.620 nm.

It is, therefore, possible to custom-tailor lattice constants in the range of 0.539 to 0.620 nm with the fluoride mixed crystal since these lattice constants vary continuously and monotonically with the composition. In this context the metal atoms in the formula $MF_2$ may consist of only one, or two or three different, or all four of the above-mentioned elements. As is the case in the example shown in FIG. 1, the composition of the intermediate layer can be changed gradually or stepwise in the course of its growth, so that the partial intermediate layers will exhibit different lattice constants in such a way that at the interfaces to semiconductor substrate 1 and to narrow-gap semiconductor layer 3 there will be a good lattice match, meaning fewer lattice irregularities which is advantageous for obtaining a high quality epitaxially grown narrow-gap semiconductor layer 3.

A precise lattice match at the interfaces to semiconductor layer 2 is not always a prerequisite for epitaxially producing a narrow-gap semiconductor layer 3 which has the required electronic material properties. For instance, a good PbSe layer with a strong increase in Hall mobility (up to $10^5$ cm$^2$/Vsec at temperature below 30 K) can be obtained during the cooling process, if only BaF$_2$ or, in stages, at first CaF$_2$ and then BaF$_2$, is grown as the intermediate layer 2.

In some cases it may be appropriate and advantageous, for chemical reasons or to improve the adhesive property, to attach at least one additional intermediate layer which is only a few mono-layers thick between semiconductor substrate a (FIG. 1) and narrow-gap semiconductor layer 3; the additional intermediate layer need not be an epitaxy layer but should not affect the epitaxial growth of layer 2 or 3 above it. Such an additional intermediate layer can be, e.g., a thin oxide layer on substrate 1 or between intermediate layer 2 and narrow-gap semiconductor layer 3. But it is also possible to attach an additional thin intermediate layer of the type described betwen two epitaxially-produced fluoride intermediate layers.

As a result of the invention described, it is possible to construct narrow-gap semiconductor layer 3 epitaxially on semiconductor substrate 1 with the help of intermediate layer 2, even though the lattice constants of the materials used for the semiconductor substrate and the narrow-gap semiconductor layer show a considerable difference in value, up to 16% depending on the material. Without the intermediate layer it would be impossible for physical reasons to connect materials epitaxially to one another which have such large differences in their lattice constants. The use of an intermediate layer with a cubic calcium fluoride structure, especially MF$_2$, makes it also possible to obtain excellent optical-electronic properties of the monolithic device. In this connection reference is made to the following publications: H. Zogg, W. Vogt and H. Melchior in *Infrared Phys.* 25, 333 (1985) and H. Zogg and M. Hueppi in *Appl. Phys. Lett.* 47 (1985).

The optical-electronic device is particularly well-suited for use as a so-called focal plane array within an electronic thermal imaging camera, whereby—during operation in the customary manner—a cooling of the device down to 77 K. (−196° C.) is necessary, as usual, depending on the requirements and on the wave-length range.

The device, in accordance with the invention, can also be designed as an optical-electronic transducer which conducts infrared radiation and with the help of which it is possible to modulate infrared radiation.

I claim:

1. Optical-electronic component with at least one infrared sensitive optical-electronic transducer that conducts or emits infrared radiation, comprising a semiconductor substrate, an intermediate layer epitaxially group grown on the substrate, a narrow-gap semiconductor layer epitaxially grown on said intermediate layer, and an optical-electronic transducer integrated in said narrow-gap semiconductor layer, said intermediate layer at its interfaces with said semiconductor substrate and said narrow-gap semiconductor layer providing lattice constants which lie between, or in proximity of, those of the semiconductor substrate or, respectively, those of the narrow-gap semiconductor, said semiconductor substrate consisting of a material selected from the group consisting of Si, Ge, Ga$_x$Al$_{1-x}$As with $0 \leq x \leq 1$, InP, GaSb, InSb and CdTe and, and the intermediate layer consisting of Ca$_x$Sr$_y$Ba$_z$Cd$_{1-x-y-z}$F$_2$ with $0 \leq x \leq 1$, $0 \leq y \leq 1$ and $0 \leq z \leq 1$.

2. Optical electronic device in accordance with claim 1, wherein the intermediate layer is constructed of at least two partial intermediate layers whose lattice constants form a series from a value which is close to those of the lattice constants of the semiconductor substrate to a value close to the lattice constants of the narrow-gap semiconductor layer.

3. Optical electronic device in accordance with claim 1, wherein the intermediate layer consists of a mixed crystal whose composition is gradually changed over the thickness of the intermediate layer in such a way that the intermediate layer at its interfaces with the semiconductor substrate and with the narrow-gap semiconductor layer exhibits lattice constants which lie close to the lattice constants of the semiconductor substrate or, respectively, the narrow-gap semiconductor layer.

4. Optical electronic device in accordance with claim 1, wherein the narrow-gap semiconductor layer consists of a mixed crystal of the group Pb$_{1-w-x}$Cd$_w$Sn$_x$S$_{1-y-z}$Se$_y$Te$_z$ with $0 \leq w \leq 1$, $0 \leq x \leq 1$, $0 \leq y \leq 1$ and $0 \leq z \leq 1$, Hg$_{1-x}$Cd$_x$Te with $0 \leq x \leq 1$ and InAs$_{1-x}$Sb$_x$ with $0 \leq x \leq 1$, wherein the parameters w, x, y and z may vary over the thickness of the narrow-gap semiconductor layer.

5. Optical electronic device in accordance with claim 1, wherein in the chemical formula of the intermediate layer the parameters x, y, z vary over the thickness of the intermediate layer in such a way that at the interfaces with the semiconductor substrate and with the narrow-gap semiconductor layer, the lattice constants of the intermediate layer are close to the lattice constants of the semiconductor substrate or, respectively, the narrow-gap semiconductor layer.

6. Optical electronic device in accordance with claim 1, wherein the narrow-gap semiconductor layer consists of a mixed crystal of the group Pb$_{1-x}$Sn$_x$Te, Pb$_{1-x}$Sn$_x$Se, Pb$_{1-x}$Cd$_x$S and PbS$_{1-x}$Se$_x$ in each case with $0 \leq x \leq 1$ and the optical-electronic transducers integrated therein function at least over a range of wavelengths within the area of 1.5 to 15 μm, and that within the semiconductor substrate is integrated at least a part of an electronic circuit arrangement for handling the electric signals of the optical-electronic transducers.

7. Optical electronic device in accordance with claim 6, wherein the optical-electronic transducer consists of a material of the group PbTe and PbS$_{1-x}$Se$_x$ with $0 \leq x \leq 1$ and a sensor sensitive in the 3–5 μm infrared window.

8. Optical electronic device in accordance with claim 6, wherein the optical-electronic transducer consists of a material of the group Pb$_{1-x}$Sn$_x$Te and Pb$_{1-x}$Sn$_x$Se whereby x is chosen in such a way that the optical-electronic transducer is a sensor sensitive in the 8–14 μm infrared window.

9. Optical electronic device in accordance with claim 1, wherein between the semiconductor substrate and the narrow-gap semiconductor layer there is at least one additional intermediate layer which is only a few mono-layers thick.

10. Optical electronic device in accordance with claim 9, wherein each said additional intermediate layer is made of an oxide and is not an epitaxy layer.

* * * * *